United States Patent [19]

Doggett

[11] Patent Number: 4,528,448
[45] Date of Patent: Jul. 9, 1985

[54] PLANE LINEAR GRATING FOR OPTICALLY ENCODING INFORMATION

[75] Inventor: David E. Doggett, Cupertino, Calif.

[73] Assignee: Benson, Inc., San Jose, Calif.

[21] Appl. No.: 377,648

[22] Filed: May 13, 1982

[51] Int. Cl.³ .............................................. G01D 5/34
[52] U.S. Cl. ......................... 250/231 SE; 250/237 G; 250/550; 350/3.71
[58] Field of Search ............. 250/231 SE, 237 G, 550; 350/3.71, 162.17

[56] References Cited

U.S. PATENT DOCUMENTS 3,544,800 12/1970 Elliott .......................... 250/231 SE
3,796,498 3/1974 Post ............................... 250/237 G
4,167,666 9/1979 Miller et al. .................... 250/237 G Primary Examiner—David C. Nelms
Assistant Examiner—James Gatto

[57] ABSTRACT

An encoding disk including a multiplicity of linear gratings placed accurately on the disk to diffract a light beam to a fixed point in space accurately does so independently of the centering of the disk on its axis of rotation.

13 Claims, 14 Drawing Figures

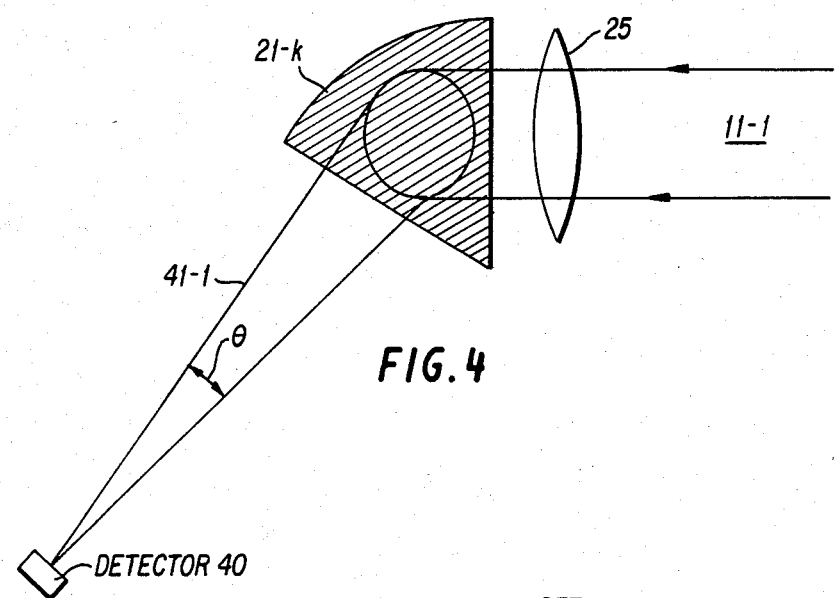
FIG. 4
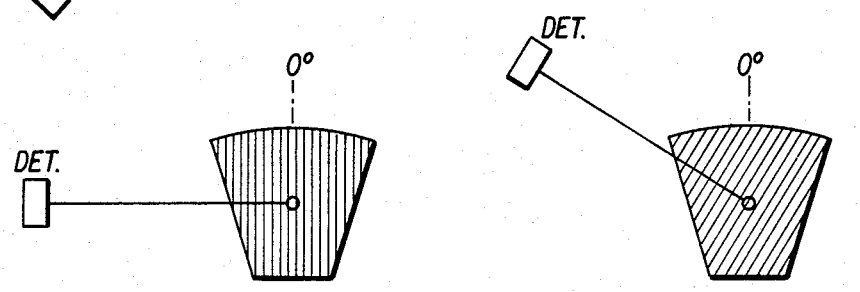
FIG. 5A    FIG. 5B
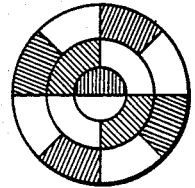 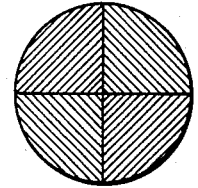 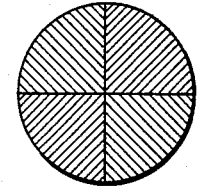
FIG. 6A    FIG. 6B    FIG. 6C
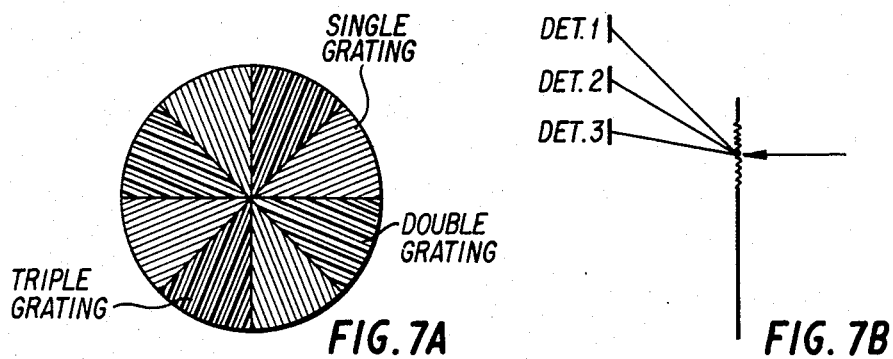
FIG. 7A    FIG. 7B

PLANE LINEAR GRATING FOR OPTICALLY ENCODING INFORMATION

BACKGROUND OF THE INVENTION

1. Field of the Invention

This invention relates to a rotatable structure containing linear diffraction gratings and in particular to the use of such a structure (such as a disk) to optically decode angular information in a mechanical system.

2. Prior Art

Rotatable holographic disks have been used for optical printers and for optically decoding the angular position of a rotating shaft in a mechanical system. However, they have not been used in a form where their centering is non-critical. Code disks to encode information wherein a number of annular bands possessing alternating opaque and transparent portions are circumferentially mounted at different radii along the disk are known in the art. In these disks, the lengths of the opaque regions dispersed with transparent regions along an annular band are used to determine the particular code to be transmitted by the disk. A light beam impinges the disk, the disk is rotated and the resulting interrupted pattern of light produces a desired code. These disks must be accurately centered and must remain centered to give high quality output signals. They are also subject to dust contamination and therefor must be kept clean.

SUMMARY OF THE INVENTION

This invention makes use of my discovery that a multiplicity of linear diffraction gratings placed accurately on a disk (or a structure of any shape which functions like a disk) will diffract a light beam to a fixed point in space independently of the centering of the disk on the axis of rotation. This result is independent of the number of gratings placed on the disk, the orientation of the grating lines on the disk (with the limitation that each grating must be oriented in a fixed angular relationship to that angle of the mechanical shaft on which the disk is located and which that particular grating is to determine) and surprisingly even is independent of the overlapping of different gratings.

Because one embodiment of my invention does not require focused light on the disk, the sensitivity of the system to dirt and dust is much less than that of a standard encoder disk.

DESCRIPTION OF THE DRAWINGS

FIG. 4 illustrates a system in which facet 21-$k$ of disk 20 (shown schematically only in FIG. 4) diffracts a light beam converged by lens 25 from parallel light beam 11-1 to form a focused beam having an angular convergence $\theta$ on detector 40.

FIGS. 5A and 5B illustrate the gratings in two facets at two different angles of orientation relative to a reference line;

FIGS. 6A, 6B and 6C illustrate three different grating configurations on disks;

FIGS. 7A and 7B illustrate, respectively a disk containing a plurality of gratings wherein certain of the gratings are single, certain other of the gratings are double and certain of the gratings are triple, and the relative location of three detectors to detect the signals produced by the grating of FIG. 7A;

DETAILED DESCRIPTION

Figure 1:
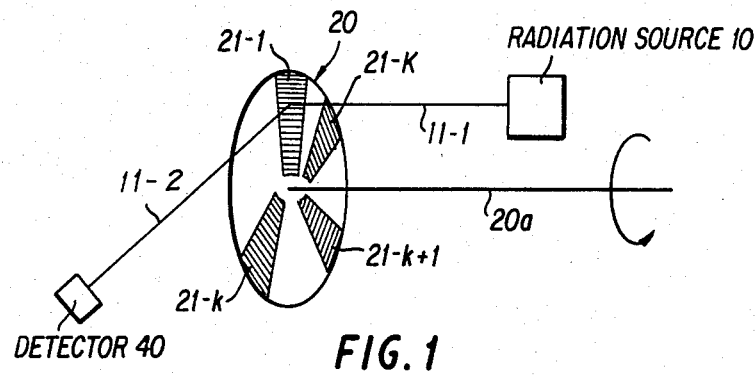
FIG. 1 illustrates a system wherein light from a radiation source is passed through a diffraction grating onto a detector.

As shown in FIG. 1, a radiation source 10 produces a light beam 11-1 which is transmitted to a rotating disk 20. Disk 20 is of well-known design and is shown schematically for the purpose of simplicity. Formed on the surface of disk 20 are diffraction gratings 21-1 through 21-K where K is an integer representing the total number of diffraction grating facets formed on the disk. Typically K will depend upon the type of encoding to be incorporated in the disk. For normal encoding, these gratings (also called facets) are evenly spaced. However, these gratings can also be logarithmically spaced or non-linearly spaced in accordance with any desired rules.

Light beam 11-1 from radiation source 10 passes through diffraction grating 21-1, for example, and then is diffracted. The diffracted beam 11-2 then sweeps an arc caused by the rotation of disk 20 about its axis 20$a$. A portion of the arc is subtended by detector 40. Thus, the light 11-1 from radiation source 10 is directed by diffraction grating 21-1 and the directed beam 11-2 is picked up by detector 40.

Figure 2:
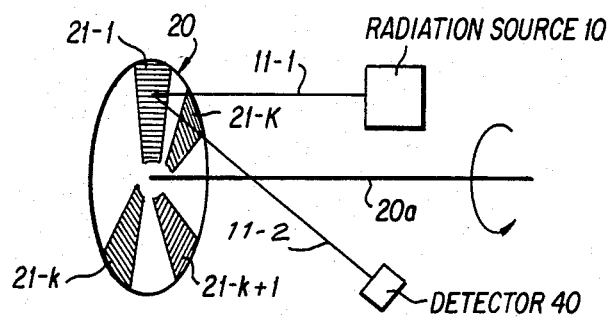
FIG. 2 illustrates a system in accordance with this invention wherein light from a radiation source is reflected from a diffraction grating onto a detector.

FIG. 2 illustrates a similar structure wherein the light beam 11-1 is reflected by diffraction grating 21-1 to form reflected beam 11-2. As in the situation where diffraction grating 21-1 passes light beam 11-1, the reflected beam 11-2 is swept across detector 40 as the disk 20 is rotated about its axis 20$a$.

Figure 3A:
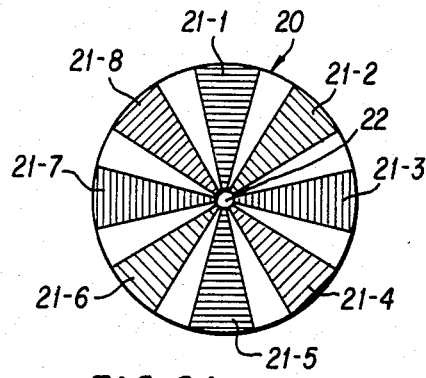
FIGS. 3A and 3B illustrate the arrangements of diffraction gratings on optical encoded disks in accordance with this invention.
Figure 3B:
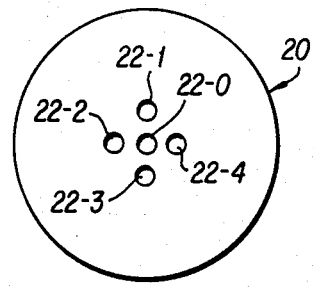

FIGS. 3A and 3B illustrate the structure of this invention in greater detail. As shown in FIG. 3A, a eight diffraction grating facets 21-1 through 21-8 are formed on disk 20. Disk 20 has formed through its center an opening 22 through which a rotational shaft is mounted. I have discovered that the location of opening 20 is not crucial to the successful operation of the encoding disk of this invention and that the location of this opening relative to the facets 21-1 through 21-8 has no effect upon the output signal produced by detector 40 in the structures of both FIG. 1 and FIG. 2. Thus, as shown in FIG. 3B, opening 22 can be precisely centered in disk 20 as shown with opening 22-0. Alternatively, opening 22 can be centered above the precise center of disk 20 as shown by opening 22-1, to the left of this precise center as shown by opening 22-2, below this precise center as shown by opening 22-3 and to the right of this precise center as shown by opening 22-4 or in fact anywhere else. In all of these cases, the encoding disk 20 when rotated, will produce a diffracted signal which strikes the detector 40 at precisely the correct time to produce an encoded output signal completely independent of the location of the opening 22 in the disk 20. Obviously, if the center of rotation is placed at such a point where the facet does not intercept the light beam (which would be the case for some facets were the center to be placed at 22-4), no light would be diffracted and therefor detector 40 would not receive a signal. However, the facets that would receive light would diffract accurately the encoded information. It should be apparent that a physical opening in the disk need not be made and that locations 22-0 to 22-4 are merely locations of the center of rotation. The disk could indeed be held by its edges or attached to a shaft by some form of adhesive or even formed of the end of a shaft.

In operation, as disk 20 rotates, the radiation 11-1 from source 10 is diffracted through an angle by the grating 21-$k$ where k is an integer given by $1 \geq k \geq K$. As the disk 20 rotates, the plane of diffraction rotates. The plane of diffraction is the plane defined by light beam 11-1 and diffracted beam 11-2. Since a linear grating is used on disk 20 (i.e., each of gratings 21-$k$ is linear), the plane of diffraction is orthogonal to the direction of the grating grooves and, I have discovered, is completely independent of the centering of the disk containing the grating. At an appropriate angle, the diffracted light will intercept the detector 40 and produce an electrical signal that will indicate the angular position of the disk. For a multiplicity of K linear gratings, such as shown in FIGS. 1, 2, and 3A, 3B, signals are produced by detector 40 whose temporal spacing is determined solely by the accuracy of the original placement of the gratings on the encoded disk 20 and the angular velocity of the disk in the mechanical system. Thus, the signals produced by detectors 40 are independent of the centering of opening 22 in disk 20.

In the manufacture of disks 20, diffraction gratings such as 21-1 through 21-K (FIG. 1) can be produced by the interference of two beams of mutually coherent light by a process of interference and the diffraction grating so produced is termed a holographic grating. Furthermore, by the nature of holography, the diffraction grating so produced can be superimposed to produce areas on a disk such as disk 20 that will diffract multiple spots that can be used to improve the numerical aperture of the diffracted radiation in a system where a large number of gratings are used. The numerical aperture NA of the diffracted radiation is defined as NA=N sin $\theta/2$ and N is the index of refraction of the medium where $\theta$ is the angle as shown in FIG. 4. This multiple grating approach can also be used to produce phase signals through the use of multiple detectors for even higher resolution of the angular position of the disk. In the schematic, parallel light beam 11-1 is focused by lens 25 onto diffraction grating 21-$k$ to form a light beam 41-1 which converges onto detector 40 with angle $\theta$.

The operation of this system is not dependent upon any particular angle of incidence of radiation 11-1 (FIG. 1) nor on a particular angle of diffraction or on the color or frequency of the radiation produced by radiation source 10 (FIG. 1). The diffraction grating lines of a particular facet 21-$k$ do not have to be parallel to a radius of the disk. Rather, the facets can each be boundless extending over the total area of the disk. Moreover, each facet can be superimposed upon other facets. When the word "facet" is used in the specification, it is used to refer to conveniently truncated borderless linear diffraction gratings.

The spacing between the lines in the diffraction grating in one embodiment of this invention used with a photocopy machine was 1.27 microns. However, any spacing desired can be used compatible with the purposes for which the disk is to be used. The formation of a number of superimposed diffraction gratings on the disk does not degrade the output signals produced from the disk but rather allows the disk to be used to produce a large number of dots to cross a light detector during one rotation of the disk.

The orientation of the detector relative to the grating lines on the facets is illustrated in FIGS. 5A and 5B. Thus, if the grating lines in a facet align parallel with an arbitrary reference line as shown in FIGS. 5A and 5B, the detectors should be oriented as shown such that the diffracted light perpendicular to the gratings strikes the detectors.

FIG. 6A illustrates the location of grating facets in different annular bands about a center of rotation of a disk for the purpose of providing coded signals.

FIGS. 6B and 6C illustrate different facet constructions of use in this invention on a disk.

FIG. 7A illustrates a composite disk containing a selected family of facets utilizing single gratings, a pair of opposed facets utilizing a double grating (i.e. two gratings of different pitches superimposed on each other) and two opposed facets with three sets of superimposed gratings on each facet. FIG. 7B illustrates the location of three detectors for detecting the light diffracted by the triple gratings illustrated in FIG. 7A.

It is also appropriate that the radiation can be acoustic and that the detector will then be a microphone.

This technique also works with microwave radiation and also systems where the wave nature of particles, such as electrons, is utilized to diffract said particles.

In another embodiment, as an alternative to increasing the number of facets, or in addition to increasing the number of facets, the number of detectors can be increased to provide greater accuracy of positional information.

While the disk 20 has been illustrated in the drawings as circular, a non-circular substrate of material with diffraction gratings formed thereon can be used in place of a disk.

In one preferred embodiment of this invention, a diffraction grating formed on a disk is used for two purposes. First, the diffraction grating diffracts a light beam which is then used to scan a photoconductive drum and which is modulated in accordance with information to be printed to produce, in a well-known manner a replica of the information in a line on the photoconductive drum. Secondly, the diffraction grating is used to control a servo controlled motor (typically a DC motor) to maintain a constant angular velocity of the disk in the printing system.

Figure 9:
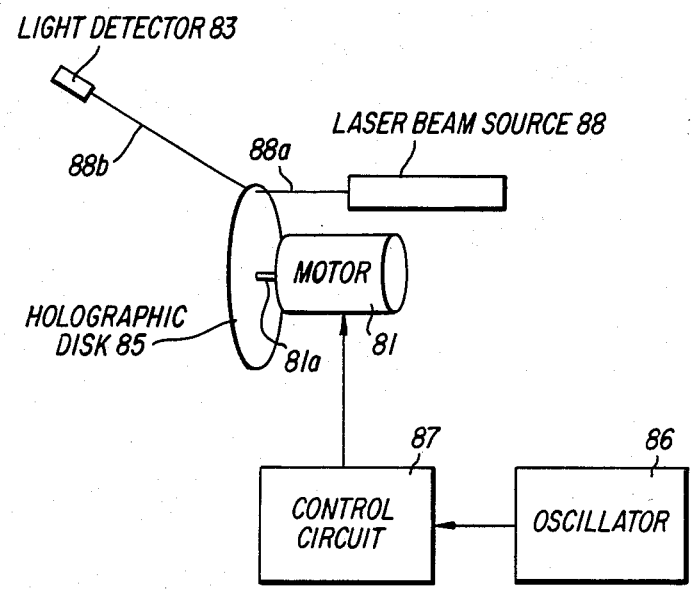
FIG. 9 illustrates a motor for driving a holographic disk and the control circuit for controlling the speed of the motor in accordance with the principles of this invention.

In the preferred embodiment, a holographic scanning disk (such as disk 20 in FIG. 2 with twelve facets each subtending 30° arc and containing linear diffraction lines perpendicular to the diffraction lines shown in facets 21 of FIG. 2) for use in printing information on a photoconductive drum has allocated a portion of the facet at the start of each scan for deflecting the laser beam (such as beam 11-1) to a light detector (such as detector 40). This light detector then sends a signal to a phase locked loop which controls the speed of a motor (not shown in FIG. 2 but shown as motor 81 in FIG. 9) in relation to a reference frequency derived from a crystal oscillator. By controlling the speed of the motor, a given number of pulses per second are derived from the rotating holographic disk. When the pulse generated by the light detector at the start of each facet on the holographic disk is detected, this also indicates the start of a print line on the photoconductive drum. The beam (such as beam 11-1 in FIG. 2) diffracted by the facet is then converted through structure disclosed in co-pending application Ser. No. 237,833 filed Feb. 25, 1981 and assigned to Benson, Inc., the assignee of this application, to form a straight line along the surface of the photoconductive drum. Application Ser. No. 237,833 is hereby incorporated by reference. The techniques for carrying out the phase-lock loop control and for implementing the printing across the photoconductive drum are well known in the art.

Figure 8:
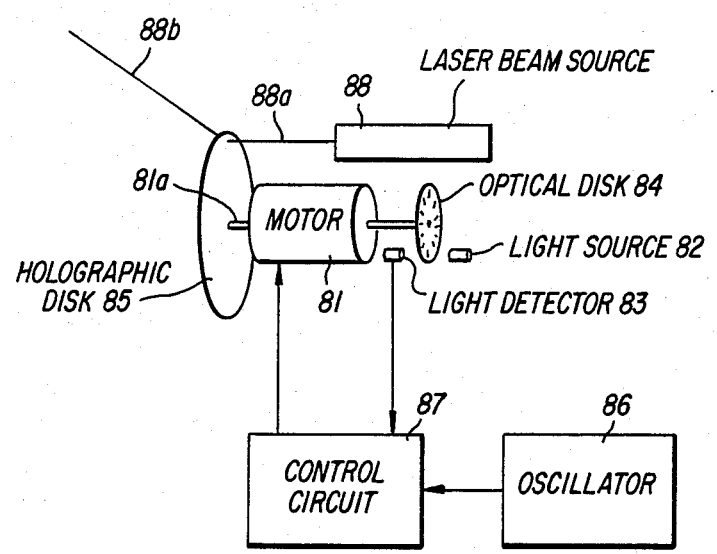
FIG. 8 illustrates a prior art system wherein a holographic disk is driven by a motor which also drives an optical disk which makes and breaks a light beam from a light source to a light detector thereby to produce pulses for use in controlling the speed of the motor.

FIG. 8 illustrates in schematic block diagram form a motor control system of the prior art. In FIG. 8, motor 81 rotates holographic disk 85 in a manner well known in the prior art to thereby diffract the light beam 88a from laser beam source 88 to produce a sweeping beam 88b. Beam 88b is then converted to a straight line using, for example, the technique disclosed in patent application Ser. No. 06/238,383 filed Feb. 25 1981 and assigned to Benson, Inc., the assignee of this application. The disclosure in application Ser. No. 06/238,383 is hereby incorporated by reference. Light beam 88b from laser beam source 88 typically is swept along a line on a photoconductive drum while its intensity is modulated thereby to store information to be reproduced on a permanent medium in a manner well known in the art.

To ensure the proper placement on the photoconductive medium of the information to be stored motor 81 must be driven at an accurate speed. This is done by deriving a sequence of pulses from the combination of optical disk 84, light source 82 and light detector 83. Optical disk 84 contains a series of transparent and opaque regions uniformly placed around a selected annulus equidistant from the center of rotation of disk 84. Light source 82 produces a continuous beam of light which is repetitively interrupted by the opaque portions of the annular ring formed on disk 84 as disk 84 rotates. Light detector 83 thus produces an output signal representing a sequence of pulses the frequency of which is proportional to the speed of motor 81. The pulse sequence from detector 83 is compared to a sequence of pulses from oscillator 86 (oscillator 86 typically comprises a crystal oscillator) in control circuit 87 and a difference signal is generated from this comparison and is used to either speed up or slow down motor 81 as appropriate.

One difficulty with the system of FIG. 8 is that if optical disk 84 is improperly centered on the axis of rotation, the sequence of pulses produced by light detector 83 varies in frequency (i.e. the pulses speed up and slow down in time) over one cycle of rotation of disk 84. Thus, centering of disk 84 is extremely important to yield accurate speed control.

In accordance with this invention, a control system is provided which produces an output signal which is independent of the centering of the holographic disk 85 (FIG. 9) on the rotating shaft of motor 81. The light beam 88a from laser beam source 88 periodically strikes light detector 83 which is located to intercept light beam 88a at the start of each facet on holographic disk 85. A typical holographic disk will contain 12 facets, each subtending 30° of arc of the disk and each containing a linear diffraction grating the grating lines of which in one embodiment possess a pitch of 1.27 microns.

Other pitches can also be used. Thus, twelve times each cycle of rotation of disk 85 beam 88b will strike light detector 83. The pulses produced by light detector 83 are transmitted to control circuit 87 which compares the frequency of the pulses from detector 83 to the frequency of the output signal from crystal oscillator 86. Control circuit 87 then produces a control signal to ensure that motor 81 is driven at the proper speed in response to these signals. My discovery that the frequency of the output signal from light detector 83 is independent of the centering of holographic disk 85 on the axis of rotation 81a of motor 81 thus makes possible a substantial reduction in the cost of manufacture of the holographic scanning system of the type disclosed in the above-cited U.S. application Ser. No. 06/238,383. The accuracy of the time interval between pulses from detector 83 depends upon the accuracy with which the gratings are placed on disk 85. These gratings can be placed very accurately on the disks using well known techniques.

Prior art structures used a separate disk which had to be accurately centered on the motor shaft to make and break successive pulses of light from a light source to a light detector and then comparing the light pulses passed by this disk to a known frequency. The system of my invention thus eliminates one optical disk and one light source compared to the prior art system, thus significantly reducing component costs. But equally important, the fact that the disk containing the linear diffraction grating does not have to be accurately centered on the motor shaft while still yielding pulses of uniform frequency from detector 83 produces an additional significant saving.

In an embodiment where the mechanical system might produce large differences in side forces on the shaft holding the encoding disk as a function of position or time, the disk and system of this invention would have its accuracy unaffected by such decentration.

The above disclosure is meant to be exemplary only not limiting. The scope of the invention is intended to be defined solely by the attached claims.

What is claimed is:

1. A device for decoding the angular position of a rotating member comprising:
    a substrate of material rotatably mountable in a position other than its center to rotate about a defined axis of rotation in a predetermined relationship to the rotation of said rotating member;
    at least one linear diffraction grating formed on or in said substrate;
    means for directing incident radiation onto said substrate at a position to impinge upon said at least one linear diffraction grating during rotation of said substrate, whereby at least a portion of said incident radiation is diffracted by said linear diffraction grating through an elongated path during rotation of said substrate;
    detector means positioned at a discrete location along a segment of said elongated path to receive said diffracted portions of said incident radiation and produce an output signal in response thereto, whereby the angular position of said rotating member is decoded independent of the centration of said axis of rotation through said substrate.

2. The device as in claim 1 including a plurality of linear diffraction gratings formed as facets around the surface of said substrate about radial lines extending from a selected position where the radial lines of the grating lines so formed are angularly spaced equally around the substrate.

3. The device as in claim 1 including a plurality of linear diffraction gratings formed as facets around the surface of said substrate about radial lines from a selected position where the radial lines of the grating lines are unequally spaced angularly but formed according to a prearranged code.

4. The device as in claim 2 wherein said linear diffraction gratings comprise transmission diffraction gratings suitable for transmitting incident light and producing a diffracted light beam.

5. The device as in claim 2 wherein said linear diffraction gratings comprise reflective diffraction gratings suitable for reflecting an incident light beam and producing a diffracted reflected light beam.

6. The device as in claim 2 wherein said facets overlap such that multiple diffraction occurs at any one angular position.

7. The device as in claim 1 wherein said means for detecting produces an output signal representing the information encoded in the diffraction gratings on said substrate, and wherein the accuracy of said output signal is independent of the center of rotation of said substrate.

8. The device as in claim 1 wherein said means for detecting includes multiple detectors for producing information at a higher data rate.

9. The device as in claim 1 wherein different arrangements of linear diffraction gratings are placed at different annular radii on the substrate.

10. The device as in claim 1 wherein said directing means directs said incident radiation onto said substrate to form a spot thereon which is large in relation to the spacing of said linear diffraction grating to minimize sensitivity to localized grating defects.

11. The device as in claim 1 wherein the angle of incidence from the normal on the substrate and the angle of diffraction from the normal (when used in transmission) are substantially the same which corresponds to the minimum in diffraction angle and a point of angular insensitivity for a transmission grating.

12. The device as in claim 1 wherein said substrate comprises a disk.

13. The device as in claim 1, wherein said substrate comprises a holographic disk containing a selected plurality of facets of linear diffraction gratings formed thereon or therein; wherein said incident radiation is substantially monochromatic; wherein said directing means directs said monochromatic incident radiation to sequentially impinge upon said plurality of facets of linear diffraction gratings as said holographic disk is rotated; wherein said detector means sequentially receives diffracted portions from selected portions of each of said facets and produces an output signal containing a plurality of pulses representative of each said detection; further comprising:

means for producing a reference frequency signal; and means for comparing the frequencies of said output signal from said detector means and said reference frequency signal and for deriving from said comparison a control signal to be used to control the speed of rotation of said holographic disk.

* * * * *